(12) United States Patent
Forster et al.

(10) Patent No.: US 10,099,245 B2
(45) Date of Patent: Oct. 16, 2018

(54) PROCESS KIT FOR DEPOSITION AND ETCHING

(71) Applicant: APPLIED MATERIALS, INC., Santa Clara, CA (US)

(72) Inventors: John Forster, Mountain View, CA (US); Zhenbin Ge, San Jose, CA (US); Alan Ritchie, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 595 days.

(21) Appl. No.: 13/831,285

(22) Filed: Mar. 14, 2013

(65) Prior Publication Data

US 2014/0262026 A1 Sep. 18, 2014

(51) Int. Cl.
| | |
|---|---|
| *C23C 16/44* | (2006.01) |
| *H01L 21/67* | (2006.01) |
| *B05C 21/00* | (2006.01) |
| *C23C 14/35* | (2006.01) |
| *H01J 37/32* | (2006.01) |
| *H01J 37/34* | (2006.01) |

(52) U.S. Cl.
CPC ............ *B05C 21/005* (2013.01); *C23C 14/35* (2013.01); *H01J 37/32623* (2013.01); *H01J 37/32642* (2013.01); *H01J 37/32651* (2013.01); *H01J 37/3408* (2013.01)

(58) Field of Classification Search
CPC .......... H01L 21/68735; H01J 37/32642; H01J 37/32495

USPC ....................................... 156/345.3; 118/503
See application file for complete search history.

(56) References Cited

U.S. PATENT DOCUMENTS

| | | | | |
|---|---|---|---|---|
| 5,632,873 | A * | 5/1997 | Stevens | C23C 14/50 118/503 |
| 5,922,133 | A * | 7/1999 | Tepman | C23C 14/50 118/503 |
| 8,647,485 | B2 * | 2/2014 | Rasheed et al. | 204/298.11 |
| 2007/0170052 | A1 * | 7/2007 | Ritchie et al. | 204/298.12 |
| 2010/0065216 | A1 * | 3/2010 | Tiller et al. | 156/345.51 |
| 2013/0192629 | A1 * | 8/2013 | Mehta et al. | 134/1 |
| 2013/0256126 | A1 * | 10/2013 | Ritchie et al. | 204/298.08 |

* cited by examiner

*Primary Examiner* — Gordon Baldwin
*Assistant Examiner* — Charlee J C Bennett
(74) *Attorney, Agent, or Firm* — Moser Taboada; Alan Taboada

(57) ABSTRACT

Variable geometry process kits for use in semiconductor process chambers have been provided herein. In some embodiments, a process kit for use in a semiconductor process chamber includes: an annular body configured to rest about a periphery of a substrate support; a first ring positioned coaxially with the annular body and supported by the annular body; a second ring positioned coaxially with the first ring and supported by the first ring; and an annular shield comprising a horizontal leg positioned coaxially with the second ring such that a portion of the horizontal leg is aligned with and below portions of the first ring and second ring.

19 Claims, 5 Drawing Sheets

PROCESS KIT FOR DEPOSITION AND ETCHING

FIELD

Embodiments of the present invention generally relate to semiconductor processing equipment, and more particularly, to process kits for use in semiconductor process chambers.

BACKGROUND

During semiconductor processing in a process chamber, a substrate resting on a substrate support may undergo processes that deposit material on the substrate and to remove, or etch, portions of the material from the substrate, often in succession or in alternating processes. It is typically desirable to have uniform deposition and etching rates across the surface of the substrate. However, the inventors have noted that process non-uniformities often exist across the surface of the substrate and may be significant at the perimeter edge of the substrate. These non-uniformities at the perimeter are attributable to electric field termination effects and are sometimes referred to as edge effects.

During deposition, a process kit containing at least a deposition ring is sometimes provided to favorably influence the edge effects causing the non-uniformity at the substrate edge. The deposition ring generally is positioned around the substrate and rests on a portion of the substrate support. The deposition ring and other chamber components may also separate a processing volume of the chamber from a non-processing volume of the chamber, beneficially protecting some surfaces of the chamber from the processing environment.

Similarly, during etching, a ring is often provided around the substrate to, among other things, beneficially influence the removal of material from the substrate.

Deposition rings and etch rings, however, typically have different profiles and are positioned differently with respect to the substrate. In processes comprising a series of deposition/etching steps in rapid succession, process specific rings are not practical. Accordingly, the overall process suffers because a less than optimal ring configuration is used for each process.

Accordingly, the inventors have devised embodiments of an improved process kit for use in deposition and etching processes.

SUMMARY

A process kit for use with a substrate support of a process chamber is provided herein. In some embodiments the process kit may comprising an annular body having an inner wall and a bottom surface configured for support on a portion of a substrate support; a first ring comprising a first bottom surface and a first outer edge including a downwardly directed first projection, the first ring positioned coaxially with the annular body such that at least a portion of the first bottom surface is supported by an upper surface of the annular body; a second ring comprising a second bottom surface and a second outer edge including a downwardly directed second projection positioned coaxially with the first ring such that a portion of the second bottom surface is supported by an upper surface of the first ring; and an annular shield comprising a generally vertical leg, an inwardly directed horizontal leg including an upwardly directed third lip, the shield positioned coaxially with the second ring such that a portion of an upper surface of the horizontal leg is aligned with and below the second projection and a portion of the third lip is aligned with and below a portion of the first projection.

In some embodiments, an apparatus for processing a semiconductor substrate may include a process chamber body enclosing a processing volume and having a substrate support supported for vertical displacement disposed within the processing volume, the substrate support having a substrate support surface; and a process kit disposed in the processing volume, the process kit comprising an annular body having an inner wall defining an opening corresponding to the substrate support surface, and a bottom surface configured for support on a portion of a substrate support; a first ring comprising a first bottom surface and a first outer edge including a downwardly directed first projection, the first ring positioned coaxially with the annular body such that at least a portion of the first bottom surface is supported by an upper surface of the annular body; a second ring comprising a second bottom surface and a second outer edge including a downwardly directed second projection positioned coaxially with the first ring such that a portion of the second bottom surface is supported by an upper surface of the first ring; and an annular shield comprising a generally vertical leg having a top portion coupled to the chamber body, an inwardly directed horizontal leg including an upwardly directed third lip, the shield positioned coaxially with the second ring such that a portion of an upper surface of the horizontal leg is aligned with and below the second projection and a portion of the third lip is aligned with and below a portion of the first projection, such that a first vertical displacement of the substrate support in a first direction changes the relative position of the third top surface with respect to the substrate support surface and maintains the relative position of upper surface, the first top surface, and the second top surface with respect to the substrate support surface; a second vertical displacement of the substrate support in the first direction changes the relative position of the third top surface and second top surface with respect to the substrate support surface and maintains the relative position of the upper surface and the first top surface with respect to the substrate support surface; and a third vertical displacement of the substrate support in the first direction changes the relative position of the first top surface, the second top surface, and the third top surface with respect to the substrate support surface and maintains the relative position of the upper surface with respect to the substrate support surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of process kits for use in semiconductor process chambers are provide herein. Embodiments of the inventive process kit advantageously may provide a more uniform electric field near the edge of the substrate during processing which may include deposition and etching processes is succession. The more uniform electric field has been observed to reduce undesired process non-uniformities in both deposition and etching across the substrate.

Process kits in accordance with the present invention comprise a plurality of components cooperating to provide a first geometry to advantageously influence the electric field termination effect (or edge effect) at the wafer edge during deposition processes. The plurality of components also cooperate to provide a second geometry to advantageously influence the edge effect at the wafer edge during etching processes. The disclosed process kits react to vertical positioning of a substrate support to modify the edge geometry.

The embodiments described in this disclosure are drawn to generally ring-shaped or annular elements. Accordingly, "inner" or "inwardly directed" mean directed to towards the radial center point of the annular elements. The use of "downward" or "downwardly", or "upward" or "upwardly" as used in this application are intended to refer to the vertical direction with respect to the orientation of elements when positioned for use in a processing chamber where a substrate is supported horizontally on a substrate support disposed at a bottom of the processing chamber. Other substrate supporting orientations may also be used with the process kit maintaining the same relative orientation as disclosed herein.

Figure 1:
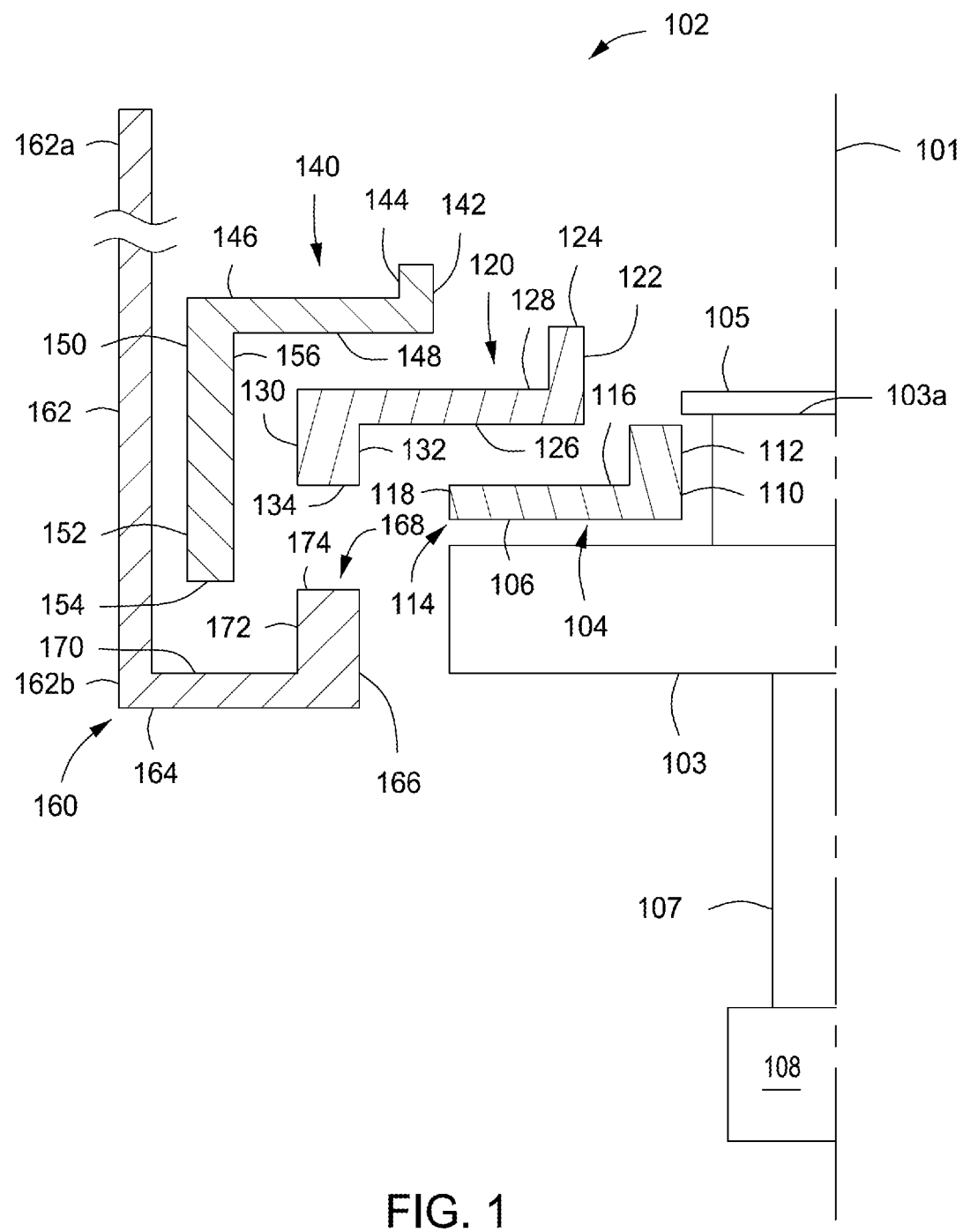
FIG. 1 depicts a schematic side sectional view of a process kit about a centerline in accordance with embodiments of the present invention.

FIG. 1 depicts a side sectional schematic view of a process kit 102 positioned coaxially about a centerline 101 according to a non-limiting embodiment of the present invention. The centerline may correspond to the centerline of a substrate support 103, illustrated with a substrate 105 supported in a substrate support surface 103a for clarity. The support surface 103a is sized to support a substrate 105 thereupon, for example a 200 mm, 300 mm, or 450 mm diameter semiconductor wafer or other suitable substrate. Elements of the process kit 102 are depicted spaced apart to more clearly illustrate their features.

The substrate support 103 is supported by a shaft 107 for at least vertical displacement along central axis 101 within a processing chamber by a lifting mechanism 108. The process kit 102 comprises an annular body 104 comprising a bottom surface 106 adapted to rest upon a portion of a substrate support 103 for support. The body 104 has an inner wall 110 forming a central opening corresponding to the substrate support surface 103a. The annular body 104 may include an upwardly directed lip 112 and a radially outwardly directed portion 114, an upper surface 116, and an outer wall 118.

As illustrated in FIG. 1, a portion of the substrate 105 supported upon substrate support surface 103a overlaps a portion of the upwardly directed lip 112. The substrate 105 supported on the may extend over some or all of the upwardly directed lip 112. The surface of lip 112 may be coplanar with the substrate support surface 103a or may be offset a distance below the substrate support surface 103a such that the substrate does not contact the lip 112 when the substrate is disposed on the substrate support surface 103a.

A first ring 120 is coaxially disposed about an outer periphery of the annular body 104. The first ring 120 has first inner edge 122 including an upwardly directed first lip 124, a first top surface 128, and a first bottom surface 126 partially overlapping the top surface 116 of the body 104. The first outer edge 130 includes a downwardly directed first projection 132 having a surface 134.

A second ring 140 is coaxially disposed about an outer periphery of the first ring 120. The second ring has a second inner edge 142 including an upwardly directed second lip 144, a second top surface 146, and a second bottom surface 148 partially overlapping the top surface 128 of the first ring 120. The second outer edge 150 of the second ring 140 includes a downwardly directed second projection 152 including a lower surface 154 and a second inner wall 156.

The process kit 102 comprises an annular shield 160 having a generally L-shaped cross section coaxially disposed about a periphery of the second ring 140. The shield 160 has a vertical leg 162, with an upper portion 162a, and an inwardly directed horizontal leg 164 at a lower portion 162b of the vertical leg 162. The horizontal leg 164 has an upper surface 170 and an inner edge 166 including an upwardly directed third lip 168 having a top surface 174 at an inner portion of the horizontal leg 164. The shield 160 is disposed about the outer periphery of the second ring 140 and positioned such that the upper surface 170 of the horizontal leg 164 is below the lower surface 154 of the second ring 140 and an outer edge 172 of the upwardly directed third lip 168 is adjacent to the inner wall 156.

The shield 160 is illustrated as an angular L-shape for ease of illustration. In other embodiments, the shield 160 may have a J-shape cross section with the lower portion (corresponding to horizontal leg 164 illustrated in FIG. 1) comprised of curved sections rather than linear portions. Other suitable cross sectional shapes are contemplated.

The components of the process kit 102, i.e., the body 104, the first ring 120, the second ring 140 and the shield 160 may be formed from process compatible materials including non-limiting examples such as coated or uncoated aluminum (Al), stainless steel, titanium (Ti), or ceramic. Coatings may include such non-limiting examples as Al arc-spray, or Ti coating, or the like.

The inventors have observed non-uniformities in both deposition and etching at a substrate edge. In particular, in deposition processes, a higher deposition rate is typically found at the edge of the substrate. In etching processes, the etching rate is significantly higher at the substrate edge, and can be as much as four times the etching rate at other areas of the substrate. Collectively, these phenomena are referred to as the edge effect.

The inventors have noted that during deposition, a process ring placed adjacent to the substrate edge beneficially influences the edge effects during deposition. Through experimentation and investigation, the inventors have observed that by modifying the geometry or configuration of a raised lip at the substrate edge, deposition thicknesses variations at the edge of the substrate, as compared to deposition thickness toward the center of the substrate, can be reduced, or eliminated.

When used in a process chamber, the process ring profile for deposition processes according to the present invention may also be in a configuration to separate a non-processing volume of a chamber, for example the volume below the substrate support surface 103a, from process gases and deposition materials.

However, the inventors have noted that a process ring configuration favorable to deposition does not necessarily provide the same beneficial results in etching processes.

The inventors have observed that the edge effects during etching processes can be favorably influenced by providing a process ring at or above the substrate edge. Some process ring configurations, different from those favorably used in deposition processes, have been shown to reduce the greater etching rate at the substrate edge, and in some cases, can even reverse the edge etch rate to be less than the etching rate at other areas of the substrate.

Through investigation and study, the inventors have developed a variable geometry process kit that provides enhanced performance in deposition processes in a first configuration and, in a second configuration, provides enhanced performance in etching processes. The inventive process kit may provide improved performance in both deposition and etching operations over conventional process kits.

In practicing the present invention for both deposition and etching operations, the lower surface 106 of annular body 104 rests, or is supported, on a portion of the substrate support 103 with inner wall 110 adjacent to the substrate support surface 103a as depicted in FIG. 1. In some instances in which the substrate support surface 103a is raised, the upper surface of the lip 112 does not extend beyond the plane of the substrate support surface 103a. In other embodiments, the upper surface of the lip 112 does extend beyond the plane of the substrate support surface 103a. The annular body 104 may be removably coupled to the substrate support 103.

Figure 2:
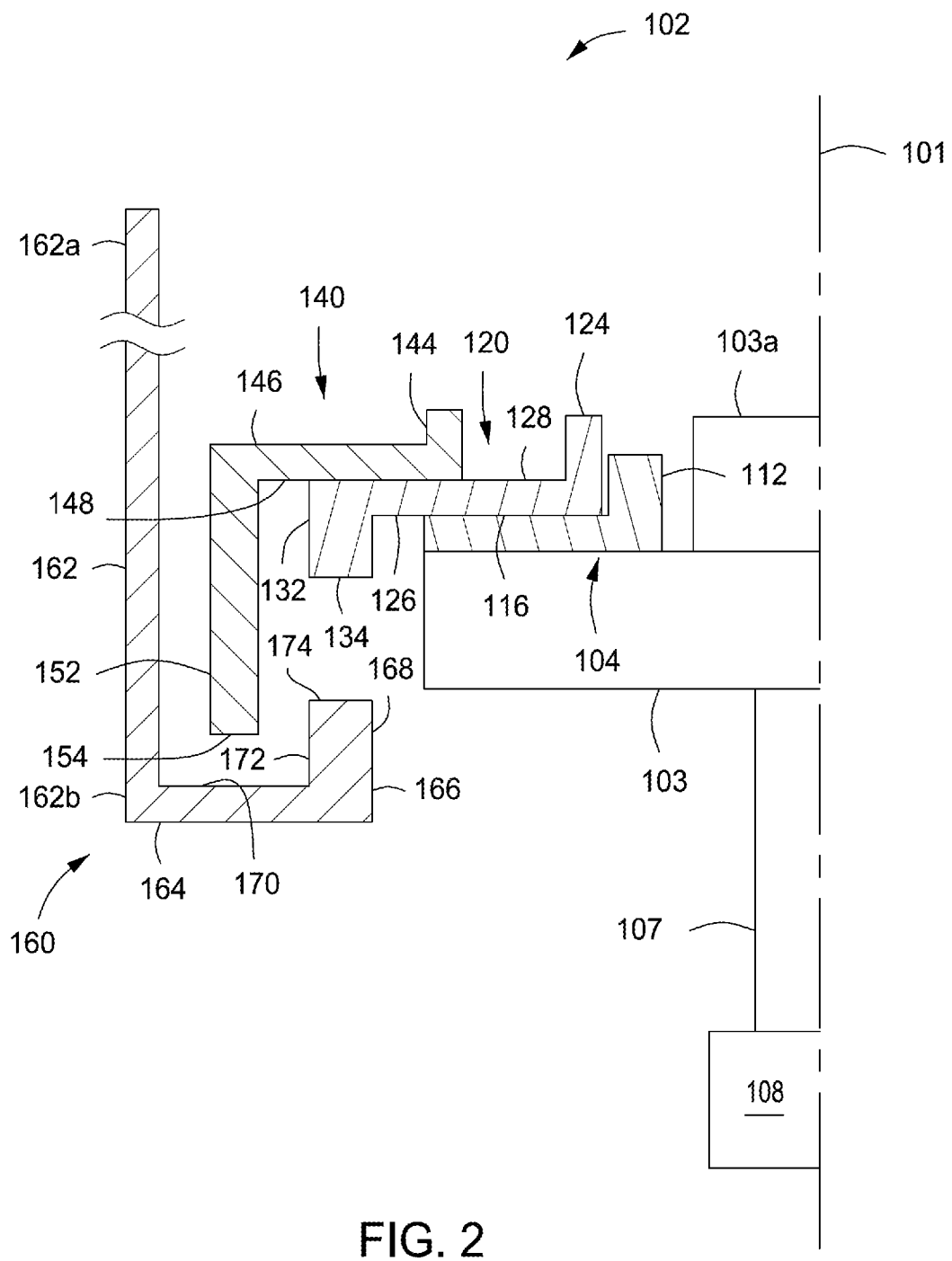
FIG. 2 depicts the process kit of FIG. 1 in a configuration favorable for deposition processes in accordance with embodiments of the present invention.

FIG. 2 is illustrative of a process kit according to an embodiment of the present invention in a first configuration that may be favorable for a first substrate process, for example, a deposition process. The annular body 104 is supported upon the substrate support 103 about the substrate support surface 103a.

The first ring 120 is disposed coaxially and above a portion of the annular body 104 such that at least a portion of the first bottom surface 126 is supported on at least a portion of the upper surface 116 of the annular body 104. The first upwardly directed lip 124 may extend beyond (i.e., above) the upwardly directed lip 112 of the annular body 104. In some embodiments, the first ring 120 may be formed such that the first upwardly directed lip 124 is below the underside of the substrate 105 supported in the substrate support surface 103a. In other embodiments, the first ring 120 may be formed such that the first upwardly directed lip 124 is co-planar with the underside of the substrate 105 or may extend above the bottom surface of the substrate 105.

The second ring 140 is coaxially disposed above a portion of the first ring 120 such that at least a portion of the second bottom surface 148 is supported on at least a portion of the first top surface 128. The second ring 140 may be formed and positioned such that the second lip 144 is disposed at a location along the first top surface 128. The second lip 144 may extend above the plane of the first lip 124 and the lip 112 of the annular body. In other embodiments, the second lip 144 may be coplanar with, or offset below, the plane of the first lip 124 or the plane of the lip 112 of the annular body.

The inventors have observed that some combinations of lip height, lip shape, and thickness in a radial direction favorably influence the edge effects at the edge of a substrate 105 supported on the substrate support surface 103a for processing, for example a deposition process. The upwardly directed lip 112, the first lip 124, and the second lip 144 are illustrated as rectangular in cross section for ease of illustration only. The cross sectional shape of one or more of the lips 112, 124, and 144 may advantageously have one or more different shapes, including non-limiting examples such as semi-circular, or polygonal shapes such as trapezoidal, triangular, or rhomboid.

The annular shield 160 is oriented such that the upper portion 162a may be coupled to a portion of a chamber body (504 in FIG. 5), at a point above the substrate support surface 103a. In a position favorable for a deposition process as depicted in FIG. 2, second ring 140 is supported such that the lower surface 154 of the second projection 152 is spaced above the upper surface 170 of the horizontal leg 164.

In a first configuration depicted in FIG. 2, the components of the process kit 102 (i.e., the annular body 104, the first ring 120, the second ring 140, and the shield 162) cooperate to favorably influence a substrate processing step, for example a deposition process. In particular, the inventive process kit 102 has been observed to minimize deposition non-uniformities (edge effect) at the edge of a substrate 105 supported on a substrate support surface 103a.

Figure 3:
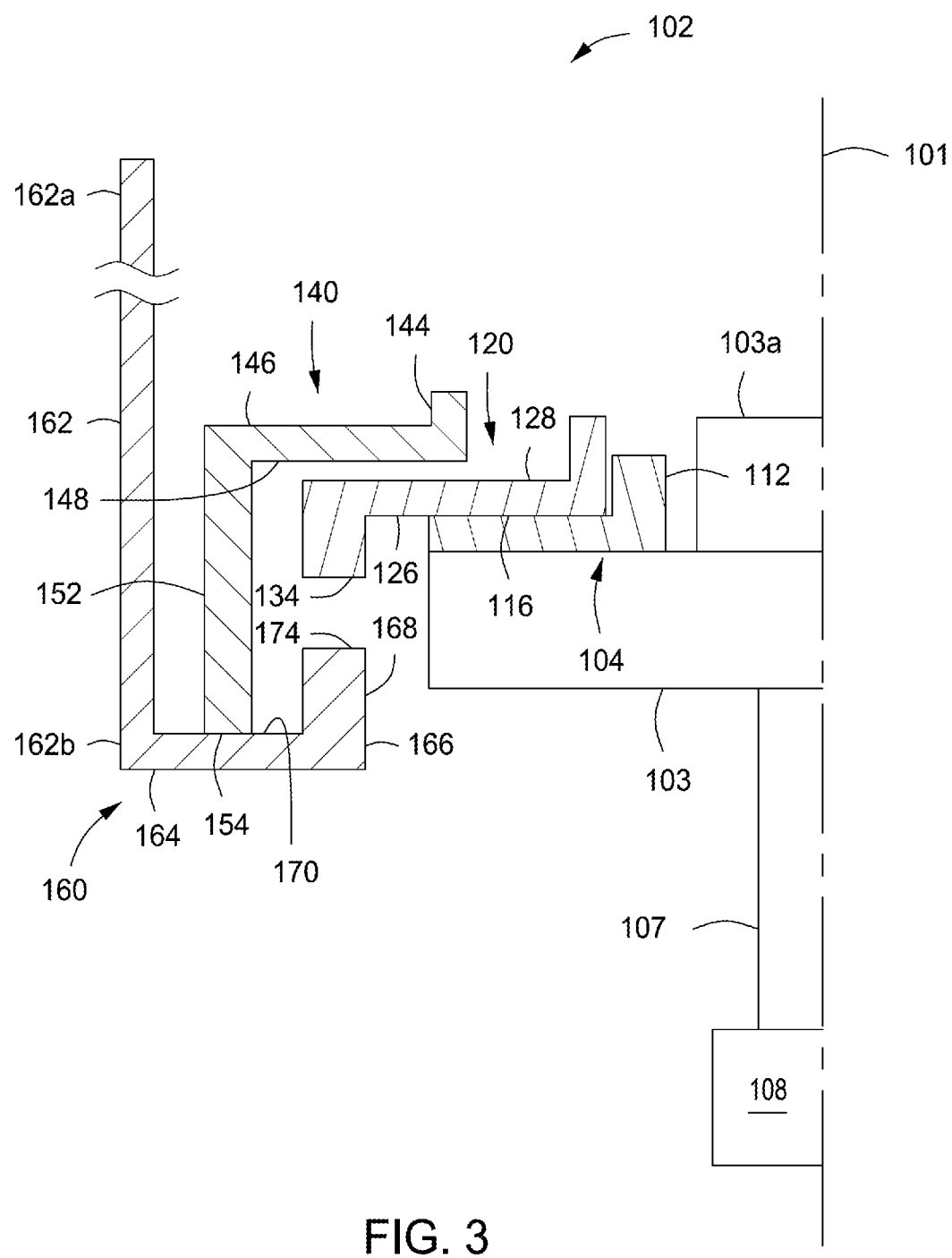
FIG. 3 depicts the process kit of FIG. 1 in a configuration favorable for deposition or etching processes in accordance with embodiments of the present invention.

FIG. 3 depicts a second configuration for the inventive process kit 102 that may advantageously modify the edge effects in steps used to process substrates, e.g., a second process, such as a deposition or etching process. As illustrated, the substrate support 103 has been displaced in a first vertical direction, i.e., downwardly, from the configuration of FIG. 2 by action of the lifting mechanism 108. The downward displacement of the substrate support 103 also displaced the annular body 104 and the first ring 120 by equal amounts. Thus, the relative position of the annular body 104, and the first ring 120 with respect to the substrate support 103, the substrate support surface 103a, and the substrate 105 supported on the substrate support surface 103a is unchanged from the relative position of the first configuration depicted in FIG. 2.

The displacement of the substrate support 103 is sufficient to bring the lower surface 154 of the second ring 140 into contact with the upper surface 170 of horizontal leg 164, arresting further downward displacement of the second ring 140. Rather than have the second bottom surface 148 supported on a portion of the first top surface 128 as in the first configuration illustrated in FIG. 2, the lower surface 154 of the second projection 152 is supported on the upper surface 170 of the horizontal leg 164 of the shield 162. In the second configuration as illustrated in FIG. 3, the relative position of the second ring 140 and the shield 160 with respect to the substrate support 103, the substrate support surface 103a, and the substrate 105 supported on the substrate support surface 103a has changed from the first configuration depicted in FIG. 2. The relative position of the upper surface 116 and the first top surface 128 with respect to the substrate support 103, the substrate support surface 103a, and the substrate 105 supported on the substrate support surface 103a remains unchanged from that of the first configuration illustrated in FIG. 2.

Although a particular second configuration is illustrated in FIG. 3, other second configurations are possible by vertically displacing the substrate support 103, the annular ring 104, the first ring 120 and the substrate 105, either upwardly or downwardly, while maintaining the lower surface 154 of the second projection 152 in supporting contact with upper surface 170 of horizontal leg 164. With such movement, the relative position of the shield 160 and the second ring with respect to the first ring 120, the annular body 104, the substrate support 103, and the substrate 105 may be altered to beneficially influence the edge effects at the edge of the substrate 105.

The inventors have observed that the second configuration illustrated in FIG. 3, as well as variations to the second configuration, may beneficially influence the edge effects of both deposition process and etching processes.

Figure 4:
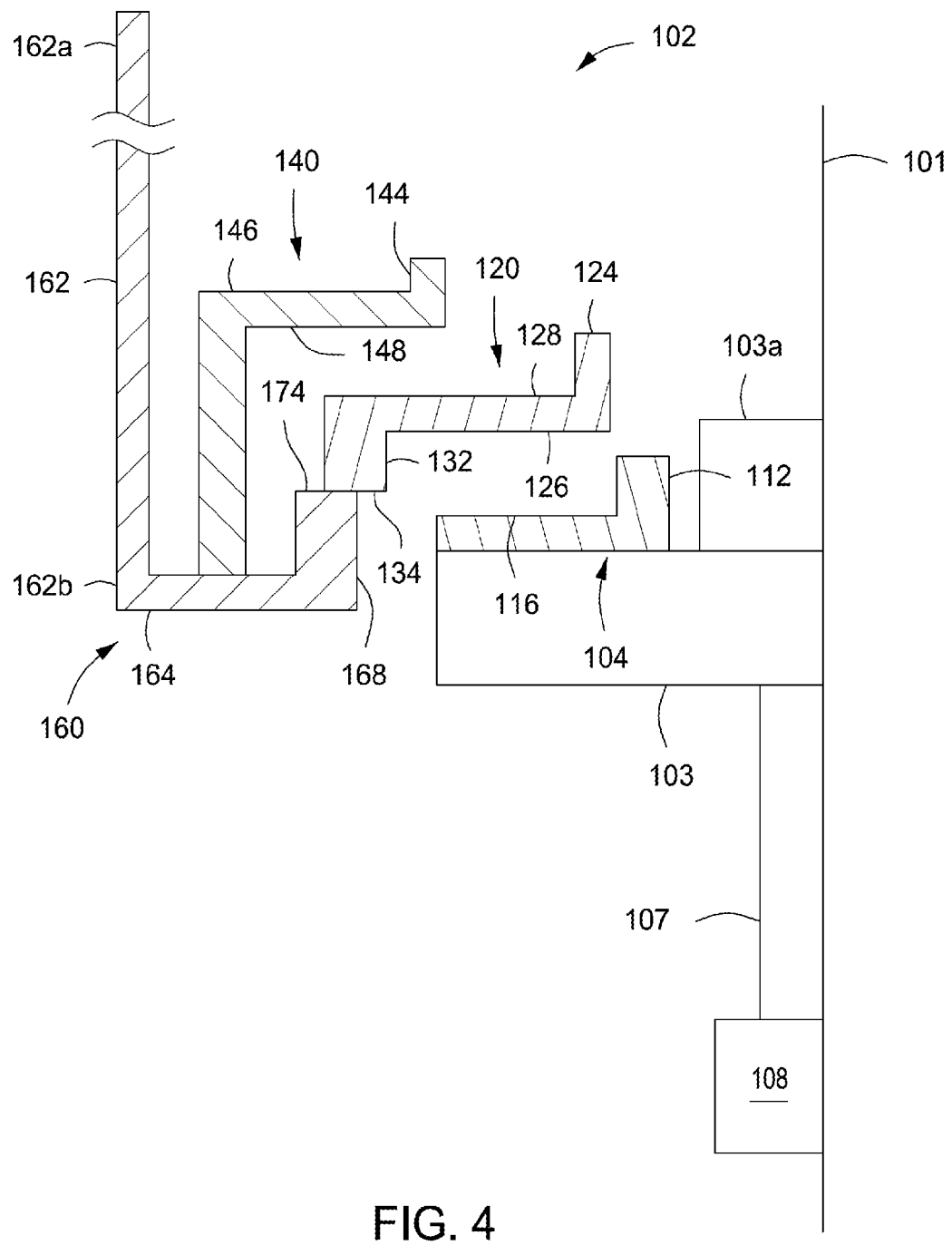
FIG. 4 depicts the process kit of FIG. 1 in a configuration favorable for etching processes in accordance with embodiments of the present invention.

FIG. 4 depicts a third configuration for the inventive process kit 102 that may advantageously influence the edge effects in steps used to process substrates, such as in an etching process. As illustrated, the substrate support 103 has been displaced by a second displacement in a first vertical direction, i.e., downwardly, from the second configuration depicted in FIG. 3 by action of the lifting mechanism 108. The second downward displacement of the substrate support 103 also displaced the annular body 104 by an equal amount. Thus, the relative position of the annular body 104 with respect to the substrate support 103, the substrate support surface 103a, and the substrate 105 supported on the substrate support surface 103 is unchanged from the relative position of the second configuration depicted in FIG. 3.

The displacement of the substrate support 103 between the second configuration illustrated in FIG. 3 and the third configuration illustrated in FIG. 4 was sufficient to bring the lower surface 134 of the first projection 132 in contact with the upper surface 174 of the third lip 168, arresting further downward displacement of the first ring 120. Rather than have the first bottom surface 126 supported on a portion of the upper surface 116 as in the first and second configurations illustrated in FIGS. 2 and 3, respectively, the lower surface 134 of the first projection 132 is supported on the top surface 174 of the third lip 168 of the shield 162. In the third configuration illustrated in FIG. 4, the relative position of the first ring 120, the second ring 140, and the shield 160 with respect to the annular body 104, the substrate support 103, the substrate support surface 103a, and the substrate 105 supported on the substrate support surface 103a has changed. The relative position of the annular ring 104 with respect to the substrate support 103, the substrate support surface 103a, and the substrate 105 supported on the substrate support surface 103a has not changed.

Although a third configuration is illustrated in FIG. 4, other third configurations are possible by vertically displacing the substrate support 103, the annular ring 104, and the substrate 105, either upwardly or downwardly, while maintaining the lower surface 154 of the second projection 152 in supporting contact with upper surface 170 of horizontal leg 164 and the lower surface 134 of the first projection 132 in supporting contact with the top surface 174 of the third lip 168. With such movement, the relative position of the shield 160, the second ring 140, and the first ring 120 with respect to the annular body 104, the substrate support 103, and the substrate 105 may be altered to beneficially influence the edge effects at the edge of the substrate 105.

The inventors has observed that the third configuration illustrated in FIG. 4, as well as variations to the second configuration, may beneficially influence the edge effects of substrate processes such as etching processes.

A first vertical displacement in a second direction, i.e., upwardly, from the third configuration illustrated in FIG. 4 engages a portion of the upper surface 116 with a portion of the first bottom surface 126, vertically displacing the first ring 120 such that the relative position of the first top surface 128 and the upper surface 116 with respect to the substrate support 103, the substrate support surface 103a, and the substrate 105 supported on the substrate support surface 103a is maintained and changing the relative position of the second top surface 144 and the third top surface 174 with respect to the substrate support 103, the substrate support surface 103a, and the substrate 105 supported on the substrate support surface 103a, placing the apparatus in the second configuration for the second substrate process of FIG. 3.

A second vertical displacement of the substrate support 103 in the second direction, i.e., upwardly, from the second configuration illustrated in FIG. 3 engages a portion of the first top surface 128 with a portion of the second bottom surface 148, vertically displacing the second ring 140 such that the relative position of the second top surface 146, the first top surface 128, and the upper surface 116 with respect to the substrate support 103, the substrate support surface 103a, and the substrate 105 supported on the substrate support surface 103a, is maintained and changing the relative position of the third top surface 174 with respect to the substrate support 103, the substrate support surface 103a, and the substrate 105 supported on the substrate support surface 103a, placing the apparatus in the first configuration for the first substrate process, e.g., a deposition process.

Figure 5:
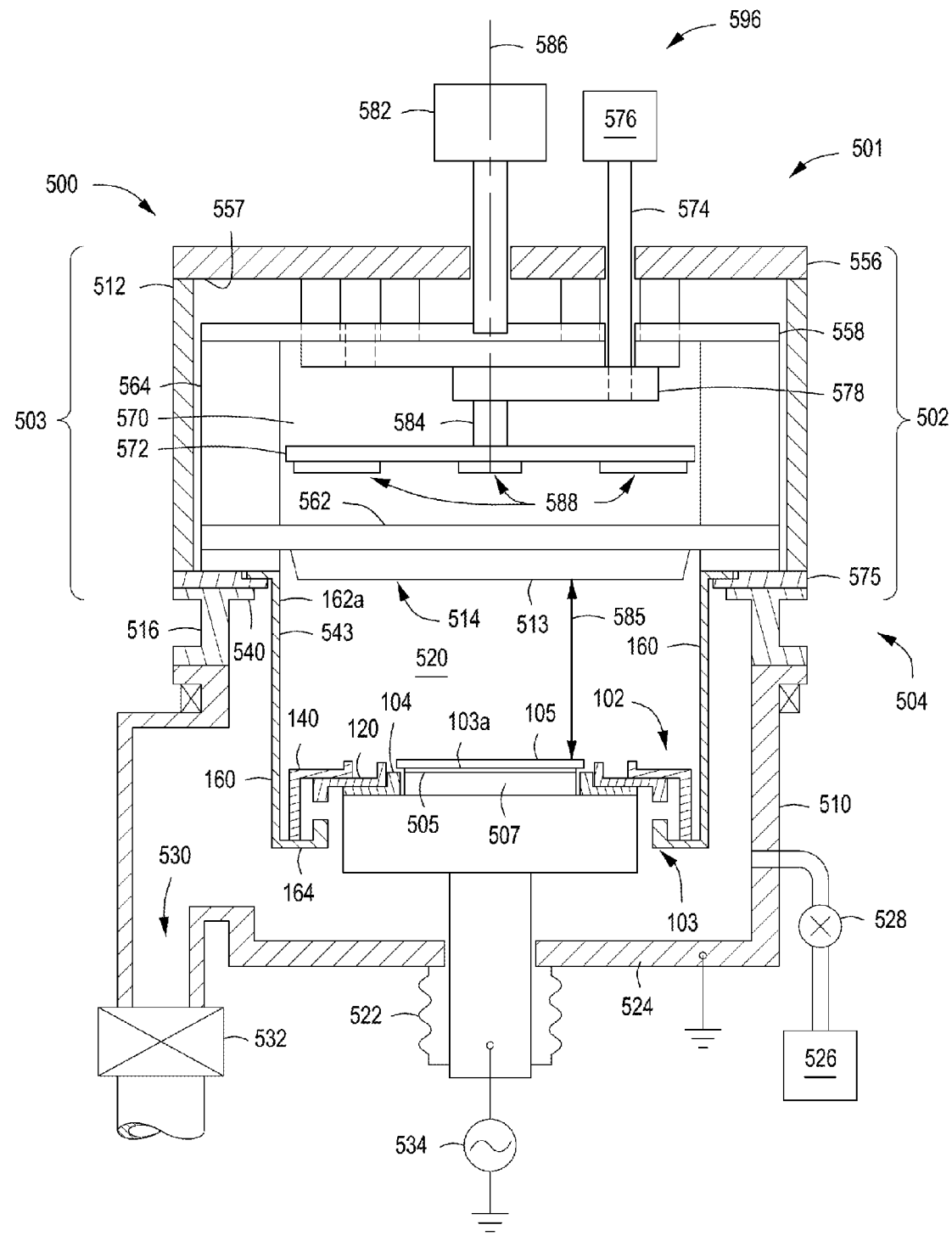
FIG. 5 depicts a schematic cross sectional view of a process chamber in accordance with some embodiments of the present invention The drawings have been simplified for clarity and are not drawn to scale. To facilitate understanding, identical reference numerals have been used, wherever possible, to designate identical elements that are common to the figures. It is contemplated that some elements of one embodiment may be beneficially incorporated in other embodiments.

FIG. 5 depicts a simplified, cross-sectional schematic diagram of an illustrative process chamber 500 of the kind that may be used to practice embodiments of the invention discussed herein. For example, the chamber may be a physical vapor deposition (PVD) chamber, having a magnetron assembly in accordance with some embodiments of the present invention. The specific configuration of the PVD chamber is illustrative and PVD chambers, or other process chambers, having other configurations may also benefit from modification in accordance with the teachings provided herein. Examples of suitable process chambers include any of the Cirrus®, AURA®, or AVENIR® lines of PVD processing chambers, commercially available from Applied Materials, Inc., of Santa Clara, Calif. Other processing chambers from Applied Materials, Inc. or other manufactures may also benefit from the inventive apparatus disclosed herein.

In practicing some embodiments of the present invention, the process chamber 500 includes a chamber lid 501 disposed atop a chamber body 504 and removable from the chamber body 504. The chamber lid 501 generally includes a target assembly 502 and a grounding assembly 503 disposed about the target assembly 502. The chamber lid 501 rests on the ledge 540 of the upper grounded enclosure wall 516. The upper grounded enclosure wall 516 may provide a portion of the RF return path between the upper grounded enclosure wall 516 and the grounding assembly 503 of the chamber lid 501. However, other RF return paths are possible.

The target assembly 502 may include a source distribution plate 558 opposing a backside of the target 514 and electrically coupled to the target 514 along a peripheral edge of the target 514. The target 514 may comprise a source material 513 to be deposited on a substrate, such as the substrate 105 during a deposition process, such as a metal, metal oxide, metal alloy, magnetic material, or the like. In some embodiments, the target 514 may include a backing plate 562 to support the source material 513. The backing plate 562 may comprise a conductive material, such as copper-zinc, copper-chrome, or the same material as the target, such that RF, and optionally DC, power can be coupled to the source material 513 via the backing plate 562. Alternatively, the backing plate 562 may be non-conductive and may include conductive elements (not shown) such as electrical feedthroughs or the like.

The target assembly 502 may include a cavity 570 disposed between the backside of the target 514 and the source distribution plate 558. The cavity 570 may at least partially house a magnetron assembly 596. The cavity 570 is at least partially defined by the inner surface of a conductive member 564, a target facing surface of the source distribution plate 558, and a source distribution plate facing surface (e.g., backside) of the target 514 (or backing plate 562). One or more portions of a magnetron assembly 596 may be disposed at least partially within the cavity 570. The magnetron assembly provides a rotating magnetic field proximate the target to assist in plasma processing within the process chamber 504. In some embodiments, the magnetron assembly 596 may include a motor 576, a motor shaft 574, a gearbox 578, a gearbox shaft 584, and a rotatable magnet (e.g., a plurality of magnets 588 coupled to a magnet support member 572).

The grounding assembly 503 may include a grounding plate 556 having a first surface 557 that may be generally parallel to and opposite a backside of the target assembly 502. A grounding shield 512 may extend from the first surface 557 of the grounding plate 556 and surround the target assembly 502. The grounding assembly 503 may include a support member 575 to support the target assembly 502 within the grounding assembly 503.

The chamber body 504 contains a substrate support 103 for receiving a substrate 105 thereon. The substrate support 103 is configured to support a substrate such that a center of the substrate is aligned with a central axis 586 of the process chamber 500. The substrate support 103 may be located within a lower grounded enclosure wall 510, which may be a wall of the chamber body 504. The lower grounded enclosure wall 510 may be electrically coupled to the grounding assembly 503 of the chamber lid 501 such that an RF return path is provided to an RF power source 582 disposed above the chamber lid 501. The RF power source 582 may provide RF energy to the target assembly 502.

The substrate support surface 103a faces a principal surface of a target 514 and may be raised above the rest of substrate support 103. The substrate support surface 103a supports the substrate 105 for processing which may include one or more deposition steps and one or more etching steps. The substrate support 103 may include a dielectric member 505 having a substrate support surface 103a for supporting the substrate 105 thereon. In some embodiments, the substrate support 103 may include one or more conductive members 507 disposed below the dielectric member 505. For example, the dielectric member 505 and the one or more conductive members 507 may be part of an electrostatic chuck, RF electrode, or the like which may be used to provide chucking or RF power to the substrate support 103.

The substrate support 103 may support the substrate 105 in a processing volume 520 of the chamber body 504. The processing volume 520 is a portion of the inner volume of the chamber body 504 that is used for processing the substrate 105 and may be separated from the remainder of the inner volume (e.g., a non-processing volume) during processing of the substrate 103 (for example, via the process kit 102). The processing volume 520 is defined as the region above the substrate support 103 during processing (for example, between the target 514 and the substrate support 103 when in a processing position).

In some embodiments, the substrate support 103 may be vertically movable to allow the substrate 105 to be transferred onto the substrate support 103 through an opening (such as a slit valve, not shown) in the lower portion of the chamber body 504 and thereafter vertically displaced to one or more processing positions. In practicing the present invention, the vertical position of the substrate support 103 also varies the geometry of the process kit 102 to modify the edge effects as discussed above. A bellows 522 connected to a bottom chamber wall 524 may be provided to maintain a separation of the inner volume of the chamber body 504 from the atmosphere outside of the chamber body 504. One or more gases may be supplied from a gas source 526 through a mass flow controller 528 into the lower part of the chamber body 504. An exhaust port 530 may be provided and coupled to a pump (not shown) via a valve 532 for exhausting the interior of the chamber body 504 and to facilitate maintaining a desired pressure inside the chamber body 504.

An RF bias power source 534 may be coupled to the substrate support 103 in order to induce a negative DC bias on the substrate 105. In addition, in some embodiments, a negative DC self-bias may form on the substrate 105 during processing. In some embodiments, RF energy supplied by the RF bias power source 534 may range in frequency from about 2 MHz to about 60 MHz, for example, non-limiting frequencies such as 2 MHz, 13.56 MHz, 40 MHz, or 60 MHz can be used. In some applications, a source frequency of 40 MHz has been observed to be very effective in ionizing the deposition species through electron impact ionization and Penning ionization.

The chamber body 504 further includes a process kit 102 comprising an annular body 104, a first ring 124, a second ring 144, and a shield 160 to surround the processing, or first volume, of the chamber body 504 and to protect other chamber components from damage and/or contamination from processing. The shield 160 may be coupled to a portion of an upper grounded enclosure wall 516 of the chamber body 504, for example a ledge 540. In other embodiments, and as illustrated in FIG. 5, the shield 160 may be coupled to the chamber lid 501, for example via a retaining ring 575. The shield 160 extends downwardly along, but spaced apart from, the walls 516 and 510 to below a top surface of the substrate support 103 when the substrate support 103 is in its lowest processing position. The shield 160 is coupled to a portion of the chamber body 504 to resist at least vertical displacement relative to the chamber body 504 during processing. A horizontal leg 164 is inwardly directed at a lower portion of the vertical leg 162. The horizontal leg has an upwardly directed lip 168 at an inner portion (e.g., forming a U- or L-shaped portion at the bottom of the shield 160).

The shield 160 comprises an inner wall 543 disposed between the target 514 and the substrate support 103 to surround the processing volume 520. The height of the shield 160 depends upon the distance 585 between the target 514 and the substrate 105 when the substrate 105 is in a position for processing. The vertical position of the substrate support 103, and correspondingly, the distance 185 between the target 114 and the substrate 105, may vary, as discussed above, when the chamber 504 is used for both deposition and etching processes. The height of the shield 160 is sufficient, when in cooperation with the annular ring 104, the first ring 124, and the second ring 140, to separate the processing volume 520 of the chamber from the remaining volume of the chamber 504 (i.e., the non-processing volume) during, for example, deposition processes.

The process kit 102 functions within the process chamber as described above to create a variable geometry that may provide enhanced performance in deposition processes in a first configuration and provide enhanced performance in etching processes in a second configuration.

Thus, variable geometry process kits for use in a semiconductor process chambers have been provided herein. The inventive process kit advantageously may affect the electric field near the edge of the substrate during processing, thereby reducing undesired edge effects during, for example, such processes as deposition and etching.

While the foregoing is directed to embodiments of the present invention, other and further embodiments of the invention may be devised without departing from the basic scope thereof.

The invention claimed is:

1. A process kit for use with a substrate support of a process chamber, comprising:
   an annular body configured to rest about a periphery of a substrate support and having an upper surface, an upwardly directed lip at an inner edge, and an outer wall;
   a first ring comprising a first top surface, a first bottom surface, a first upwardly directed lip at a first inner edge, and a first outer edge including a downwardly directed first projection, the first ring positioned coaxially with the annular body, wherein the first upwardly directed lip extends above the upwardly directed lip of the annular body when the first ring is disposed on the annular body; and
   a second ring comprising a second top surface, a second bottom surface, a second upwardly directed lip at a second inner edge, and a second outer edge including a downwardly directed second projection, the second ring positioned coaxially with the first ring such that a portion of the first top surface and the first outer edge is positioned below a portion of the second bottom surface to support the second ring,
   wherein the first ring is movably disposed with respect to the annular body, the second ring, and the substrate support.

2. The process kit of claim 1, further comprising:
   an annular shield comprising a generally vertical leg, an inwardly directed horizontal leg including an upwardly directed third lip having a third top surface, the annular shield positioned coaxially with the second ring such that a portion of the horizontal leg is aligned with and below the second projection and a portion of the third lip is aligned with and below the first projection.

3. The process kit of claim 1, wherein the annular body further comprises an inner wall defining an opening corresponding to a substrate support surface of the substrate support.

4. The process kit of claim 1, wherein the upwardly directed lip is semi-circular or polygonal in cross section.

5. The process kit of claim 1, wherein the first upwardly directed lip is semi-circular or polygonal in cross section.

6. The process kit of claim 1, wherein the second upwardly directed lip is semi-circular or polygonal in cross section.

7. The process kit of claim 2, wherein the annular shield further comprises an upper portion of the vertical leg configured to be coupled to a process chamber.

8. An apparatus for processing a semiconductor substrate, comprising:
   a process chamber body enclosing a processing volume and having a substrate support supported for vertical displacement disposed within the processing volume, the substrate support having a substrate support surface;
   a process kit in a first configuration according to claim 2, wherein:
   the annular body further comprises:
       an inner wall defining an opening corresponding to the substrate support surface; and
       a lower surface configured to engage a portion of the substrate support such that the annular body is supported by the substrate support in at least vertical displacement; and
   the annular shield further comprises:
       a top portion of the vertical leg coupled to the process chamber body such that the apparatus is configured for a first substrate process.

9. The apparatus of claim 8, wherein:
   a first vertical displacement of the substrate support in a first direction engages a lower surface of the second projection with a portion of the upper surface of the horizontal leg such that vertical displacement of the second ring in the first direction is arrested, the first vertical displacement changing the relative position of the third top surface and the second top surface with respect to the substrate support surface and maintaining the relative position of the upper surface and the first top surface with respect to the substrate support surface, placing the apparatus in a second configuration for a second substrate process.

10. The apparatus of claim 9, wherein:
    a second vertical displacement of the substrate support in the first direction engages a lower surface of the first projection with the third top surface such that vertical displacement of the first ring in the first direction is arrested, changing the relative position of the first top surface, the second top surface, and the third top surface with respect to the substrate support surface and maintaining the relative position of the upper surface with respect to the substrate support surface, placing the apparatus in a third configuration for a third substrate process.

11. The apparatus of claim 10, wherein:
    a first vertical displacement of the substrate support in a second direction engages a portion of the upper surface with a portion of the first bottom surface, vertically displacing the first ring such that the relative position of the first top surface and the upper surface with respect to the substrate support surface is maintained and changing the relative position of the second top surface and the third top surface with respect to the substrate support surface, placing the apparatus in the second configuration for the second substrate process.

12. The apparatus of claim 11, wherein:
    a second displacement of the substrate support in a second direction engages a portion of the first top surface with a portion of the second bottom surface, vertically displacing the second ring such that the relative position of the second top surface, the first top surface, and the upper surface with respect to the substrate support surface is maintained and changing the relative position of the third top surface with respect to the substrate support surface, placing the apparatus in the first configuration for the first substrate process.

13. The apparatus of claim 11, the process chamber body further comprising:
an RF power supply coupled to the process chamber and configured for providing RF power thereto.

14. The apparatus of claim 13, wherein the process kit is configured for providing a substantially uniform deposition rate proximate a peripheral edge of a substrate disposed thereon, and wherein the process kit is configured for providing a substantially uniform etch rate proximate a peripheral edge of a substrate disposed thereon.

15. An apparatus for processing a substrate, comprising:
a chamber body enclosing a processing volume and having a substrate support supported for vertical displacement disposed within the processing volume, the substrate support having a raised substrate support surface radially inwardly offset from a perimeter of the substrate support;
an annular body comprising an upper surface, an inner wall defining an opening corresponding to the substrate support surface and an upwardly directed lip at the inner wall, an outer wall, and a lower surface supported upon the substrate support such that the inner wall is adjacent to the substrate support surface and an upper plane of the lip is even with or recessed from a plane of the substrate support surface;
a first ring comprising a first top surface, a first bottom surface, a first outer edge including a downwardly directed first projection, and a first inner edge including an upwardly directed first lip, the first ring positioned coaxially with the annular body such that at least a portion of the upper surface of the annular body and the outer wall is positioned below an inner portion of the first bottom surface;
a second ring comprising a second top surface, a second bottom surface, and a second outer edge including a downwardly directed second projection, and a second inner edge including an upwardly directed second lip, the second ring positioned coaxially with the first ring such that a portion of the first top surface and the first outer edge is positioned below a portion of the second bottom surface to support the second ring; and
an annular shield comprising a generally vertical leg having an upper portion coupled to a portion of the chamber body, an inwardly directed horizontal leg at a lower portion of the vertical leg including an upwardly directed lip having a third top surface, the annular shield positioned coaxially with the second ring such that a portion of the horizontal leg is aligned with and below the second projection and a portion of the lip is aligned with and below the first projection;
such that a first vertical displacement of the substrate support in a first direction changes the relative position of the third top surface with respect to the substrate support surface and maintains the relative position of the upper surface, the first top surface, and the second top surface with respect to the substrate support surface;
a second vertical displacement of the substrate support in the first direction changes the relative position of the third top surface and second top surface with respect to the substrate support surface and maintains the relative position of the upper surface and the first top surface with respect to the substrate support surface; and
a third vertical displacement of the substrate support in the first direction changes the relative position of the first top surface, the second top surface, and the third top surface with respect to the substrate support surface and maintains the relative position of the upper surface with respect to the substrate support surface,
wherein the upper surface of the annular body supports the first ring during the first and second vertical displacements.

16. An apparatus for processing a semiconductor substrate, comprising:
a process chamber body enclosing a processing volume and having a substrate support supported for vertical displacement disposed within the processing volume, the substrate support having a substrate support surface;
a lifting mechanism to facilitate vertical displacement of the substrate support;
a process kit in a first configuration, wherein the process kit comprises:
an annular body configured to rest about a periphery of a substrate support and having an upper surface, an outer wall, an inner wall defining an opening corresponding to the substrate support surface, and a lower surface configured to engage a portion of the substrate support such that the annular body is supported by the substrate support in at least vertical displacement;
a first ring comprising a first top surface, a first bottom surface, and a first outer edge including a downwardly directed first projection, the first ring positioned coaxially with the annular body such that at least a portion of the upper surface of the annular body is positioned below an inner portion of the first bottom surface of the first ring to support the first ring;
a second ring comprising a second top surface, a second bottom surface, and a second outer edge including a downwardly directed second projection, the second ring positioned coaxially with the first ring such that a portion of the first top surface and the first outer edge is positioned below a portion of the second bottom surface to support the second ring; and
an annular shield comprising a generally vertical leg, an inwardly directed horizontal leg including an upwardly directed third lip having a third top surface, a top portion of the vertical leg coupled to the process chamber body such that the apparatus is configured for a first substrate process, the annular shield positioned coaxially with the second ring such that a portion of the horizontal leg is aligned with and below the second projection and a portion of the third lip is aligned with and below the first projection,
wherein the vertical displacement of the substrate support facilitated by the lifting mechanism moves the annular body, the first ring, and the second ring, and
wherein an upward vertical displacement of the substrate support engages a portion of the first top surface with a portion of the second bottom surface, vertically displacing the second ring such that the relative position of the second top surface, the first top surface, and the upper surface with respect to the substrate support surface is maintained and changing the relative position of the third top surface with respect to the substrate support surface, placing the apparatus in the first configuration for the first substrate process.

17. The process kit of claim 2, wherein at least one of the annular body, the first ring, the second ring, and the annular shield comprise at least one of aluminum (Al), stainless steel, titanium (Ti), or ceramic.

18. The process kit of claim 1, wherein a first length of the downwardly directed first projection is less than a second length of the downwardly directed second projection.

19. A process kit for use with a substrate support of a process chamber, comprising:
- an annular body configured to rest about a periphery of a substrate support and having an upper surface, an upwardly directed lip at an inner edge, and an outer wall;
- a first ring comprising a first top surface, a first bottom surface, a first upwardly directed lip at a first inner edge, and a first outer edge including a downwardly directed first projection, and wherein the first ring positioned coaxially with the annular body; and
- a second ring comprising a second top surface, a second bottom surface, a second upwardly directed lip at a second inner edge, and a second outer edge including a downwardly directed second projection, the second ring positioned coaxially with the first ring such that a portion of the first top surface and the first outer edge is positioned below a portion of the second bottom surface to support the second ring, wherein the downwardly directed second projection of the second ring is the only downwardly directed projection of the second ring, and wherein the first ring is movably disposed with respect to the annular body, the second ring, and the substrate support.

* * * * *